US00RE34227E

United States Patent [19]

Asher et al.

[11] E Patent Number: Re. 34,227

[45] Reissued Date of Patent: Apr. 20, 1993

[54] NON-CYANIDE ELECTRODE CLEANING PROCESS

[75] Inventors: Reginald K. Asher; Duane W. Endicott, both of Scottsdale, Ariz.; Beng L. Lim, Malacca, Malaysia

[73] Assignee: Motorola, Inc., Schaumburg, Ill.

[21] Appl. No.: 710,853

[22] Filed: Jun. 6, 1991

Related U.S. Patent Documents

Reissue of:

[64] Patent No.: 4,968,397
Issued: Nov. 6, 1990
Appl. No.: 441,595
Filed: Nov. 27, 1989

[51] Int. Cl.[5] ..... C25F 1/00; C25F 5/00

[52] U.S. Cl. ..... 204/141.5; 204/146

[58] Field of Search ..... 204/141.5, 146

[56] References Cited

U.S. PATENT DOCUMENTS 3,912,603 10/1975 Mietens ..... 204/146

*Primary Examiner*—T. M. Tufariello
*Attorney, Agent, or Firm*—Harry A. Wolin

[57] ABSTRACT

An electrolytic process employing a water solution of metal lactates or lactic acid and metal hydroxides, rapidly and safely removes metal plating bleed, residual oxides or the like (stains), plastic flash, resin bleed and deflashing media, from electrodes of electronic devices. Anodic etching or a combination of cathodic and anodic etching is preferred. Noble metals are selectively removed without cyanide compounds. For example, excess silver from spot plating on copper leadframes is etched away 2-3 times faster than the underlying copper. After cleaning the device leads are bright, polished, stain-free and without scale, residual plating bleed, deflashing media, plastic flash or resin bleed. The process is effective, less hazardous, easy to use and economical.

47 Claims, 2 Drawing Sheets

NON-CYANIDE ELECTRODE CLEANING PROCESS

Matter enclosed in heavy brackets [ ] appears in the original patent but forms no part of this reissue specification; matter printed in italics indicates the additions made by reissue.

FIELD OF THE INVENTION

This invention relates to a process for manufacturing electronic devices and, more particularly, a process for cleaning the leads of electronic devices and other parts.

BACKGROUND OF THE INVENTION

It is commonplace in the electronics art to use leadframes for supporting and providing external leads to electronic elements such as semiconductor die. The leadframes are of a wide variety of metals including but not limited to, copper and copper alloys. A typical prior art leadframe suitable for forming a fourteen lead a dual-in-line package is shown in simplified plan view in FIG. 1.

FIG. 2 shows the leadframe of FIG. 1 after die attach and plastic encapsulation and before plastic deflash. It is usual during encapsulation molding to have plastic fill the gaps between the leads and the leadframe dam bars, i.e., inter-lead plastic. Sometimes, when molding is less than perfect there will also be a thin plastic flash on the flat portions of the leads, i.e., over-lead plastic flash. The plastic package body, the inter-lead plastic and the overlead plastic flash are indicated by the more heavily stippled regions in FIG. 2. In addition, some of the resin which makes up the resin-filler encapsulation material may be extruded from the encapsulation onto the leads, resulting is what is called "resin bleed". Resin bleed is often colorless and very difficult to detect.

FIG. 3 shows the leadframe after the dam bars, side-rails, inter-lead and over-lead plastic flash are removed. The inter-lead plastic is typically removed during trimming of the leadframe to remove the dam bars and side-rails. The over-lead plastic flash and resin bleed is typically removed by blasting the leads with a mild abrasive such as, for example, ground apricot pits.

It is frequently desirable to spot plate part of the leadframe with a noble metal, i.e., gold, silver, platinum, palladium, iridium or high alloys thereof. Silver is particularly useful because of the ease with which metallurgical bonds may be formed thereto and its moderate cost. The spot plating covers the ends of the leads where wire bonds or tab bonds from the die are attached sometimes the die flag as well, and is usually intended to be confined to an area within the boundary of the plastic body after encapsulation. This is shown in FIG. 1 where the lightly stippled region represents the desired spot plating area and the dashed outline represents the intended location of the plastic encapsulation.

A significant problem encountered with spot plating, is that it is very difficult and sometimes impossible to prevent excess and unwanted plating material from creeping laterally outward from the desired plating area along the edges and sides of the various leads. FIG. 4 shows a partial cut-away view, much enlarged, along an inter-lead space through the leadframe of FIG. 3. The lightly stippled region in FIG. 4 shows where excess plating material, as for example silver, has crept outward along the sides of the lead during the plating process and is now exposed after encapsulation, trim and plastic deflash. Excess silver plating material is known in the art as "silver flash" or "silver bleed". This excess silver, for example, is often in the range of 0.1–8 micrometers thick, typically 1–3 micrometers thick. This excess silver or other plating metal may arise from what is known in the art as "immersion" metal, which is typically 0.1–2 micrometers thick, and "bleed" metal, which is typically 5–6 micrometers thick, or a combination thereof. This invention is concerned, among other things, with removing such excess plating metal regardless of origin and the words "metal flash" or "plating flash" are intended to include "immersion", "bleed" and other forms of excess plating metal.

While such condition is in itself harmless, when solder is applied to the finished device or reflowed, the excess spot plating material on the edges or sides of the leads in the inter-lead space can cause the formation of metal whiskers that degrade the reliability and performance of the finished device. This is highly undesirable.

In the prior art, excess noble metal flash has typically been removed by immersing the parts in cyanide reagents which dissolve the excess noble metal. However, the use of cyanide is undesirable on many grounds well known in the art. Accordingly, a continuing need exists for improved processes for removing metal plating flash and particularly for metal deflash processes which do not employ cyanide.

The problem of plating flash removal is complicated by the other conditions associated with the manufacturing process which also must be accomplished. For example, the plastic deflash process can cause minute quantities of the blasting abrasive to become embedded in the leadframe, as illustrated in FIGS. 3. and 4. This is especially troublesome with relatively soft metals such as for example OFHC copper and Olin Type 194 copper. Also, plastic deflash may be incomplete and regions of plastic molding resin from the encapsulation may remain on the leads. If these regions are very thin they may be very difficult to detect with the unaided eye.

Also, various oxides or other dielectrics or resistive materials can form on the leadframe during manufacturing. These foreign materials are generally referred to in the art as "stains" because they frequently have a colored appearance. As used herein the words "stain" or "stains" are intended to include all such oxides, dielectrics, scales or other foreign materials that form on the leadframe during manufacture. Such stains are most frequently encountered when the leadframe is heated to several hundred degrees Celsius, as for example during bonding and encapsulation. Copper containing leadframes are particularly susceptible to such problems.

The embedded blasting material, stains and any residual plastic flash must be removed or they can interfere with subsequent solder plating, coating or reflow. Thus, a need continues to exist for improved processes for performing each of these operations and there is a particular need for an improved process which can do all three, i.e., remove excess spot plate metal, embedded blasting material, residual plastic flash and stains.

Accordingly, it is an object of the present invention to provide an improved method for manufacturing electronic devices including removing excess plating flash from the leads. It is a further object to provide an improved method including removing embedded blasting material from the leads. It is a still further object of the present invention to provide an improved method including removing stains from the leads. It is a yet further object of the present invention to provide an improved method including removing residual encapsulation resin from the leads. It is a still further object of the present invention to provide an improved method that accomplishes combinations of the above.

BRIEF DESCRIPTION OF THE INVENTION

These and other objects and advantages are attained by a cleaning process comprising, in a first embodiment, providing an electronic device having leads of a first metal, an exposed plated region of a second metal, and electrolytically treating the leads in a cleaning solution comprising lactic acid and a hydroxide, wherein the hydroxide conveniently is a hydroxide of a metal from columns 1A or 2A of the periodic table, and conveniently potassium or sodium hydroxide or a combination thereof. It is desirable that the leads be at least anodically biased (leads positive) in the solution. After the electrolytic treatment the leads are rinsed to remove the cleaning solution. Where anodic cleaning alone is used, the pH of the solution is desirably adjusted to be in the range 1.4–2 by addition of an inorganic acid.

In a further embodiment, the leads are first biased cathodically (leads negative) in a hydroxide-water solution with or without the lactic acid, rinsed and then biased anodically (leads positive) in the cleaning solution comprising water, lactic acid and a hydroxide. It is further desirable that the cathodic and anodic treatment times be approximately in the proportion 1:1 to 1:2, respectively, but this is not essential. While the cathodic treatment is conveniently performed in a hydroxide-water solution (e.g., 30–60 gms of KOH/liter) without lactic acid, the lactic acid-hydroxide solution used for the anodic treatment may also be used for the cathodic treatment.

The lactic acid-hydroxide cleaning solution conveniently comprises about 0.1 to 0.3 liters of 88% lactic acid and about 0.05 to 0.3 Kgms of KOH plus sufficient water to make one liter of cleaning solution. Inorganic acid (e.g., sulfuric) may be added and the proportions of lactic acid and hydroxide varied to adjust the pH in the range of about 1.4–7. The lower end of the pH range (e.g., 1.4–2) is desirable when only anodic cleaning is used and the higher end of the pH range (e.g., 4–7) is used when cathodic-anodic cleaning is used.

A typical mixture useful for cleaning leadframes of, for example copper, copper alloys or copper plated metal, comprises proportions of about 30 liters lactic acid and about 17 Kgms of KOH with sufficient water to make 100 liters of solution and gives a pH of 4–6. While the solution is described in terms of being made from lactic acid and KOH or other alkali, those of skill in the art will understand that potassium lactate (or other alkali lactate) may also be used. For example, 10–30% by volume of 60% concentration potassium lactate in water is also suitable. This mixture ordinarily has a Ph of about 5–6.

Solution temperature during cleaning are usefully in the range of about 60°–80° C. with about 70° C. being preferred for the cathodic hydroxide-water cleaning and about 40°–60° C. with about 50°–55° C. being preferred for the cathodic or anodic lactate-water cleaning. It is desirable to agitate the solution during treatment but this is not essential since only very short immersion times are generally needed, e.g., usually less than about 100–200 seconds and typically about 10–25 seconds with the preferred concentration and temperature described above. A DC voltage of 2 to 15 volts is useful with about 5 to 11 volts being convenient and about 9–10 volts being preferred.

The parts to be cleaned may be in strip form, as for example ladder leadframe strips, or may be singulated. i.e.,individual devices or metal pieces. The parts are clamped to a metal rack or placed on a metal belt or in a basket or barrel which is connected to the negative pole of the power supply for cathodic treatment and/or to the positive pole of the power supply for anodic treatment. The parts are immersed in the above described solutions and electrolytically cleaned. Where both cathodic and anodic treatments are used, an intermediate rinse is desirable. After electrolytic cleaning the parts are rinsed and then, optionally, acid dipped and plated, or dried.

The above described cleaning process rapidly removes residual stains, removes metal flash, removes embedded blasting material and removes residual plastic flash or resin bleed. For example, silver flash is removed, typically, at 2–3 times the rate of attack on the copper, copper alloy or copper coated leads. The mild lead etching facilitates loosening embedded blasting material and residual resin.

The finished leads have a bright, polished, stain-free appearance and are free of discoloration (e.g., heavy oxides or other contact inhibiting materials), residual plating metal, residual resin, and residual blasting media. A very thin surface oxide, invisible to the unaided eye, may be present after the anodic treatment which is easily removed by a brief (e.g., 2–30 seconds) acid dip. The plastic encapsulation around the device element is substantially unaffected by the above-described electrolytic cleaning process.

The invented cleaning process is particularly well suited to practical application in electronic assembly because of its effectiveness, comparatively low cost, and freedom from toxic and/or corrosive materials such as the cyanide compounds and/or the fluoboric acids used in the prior art.

DETAILED DESCRIPTION OF THE FIGURES

Figure 1:
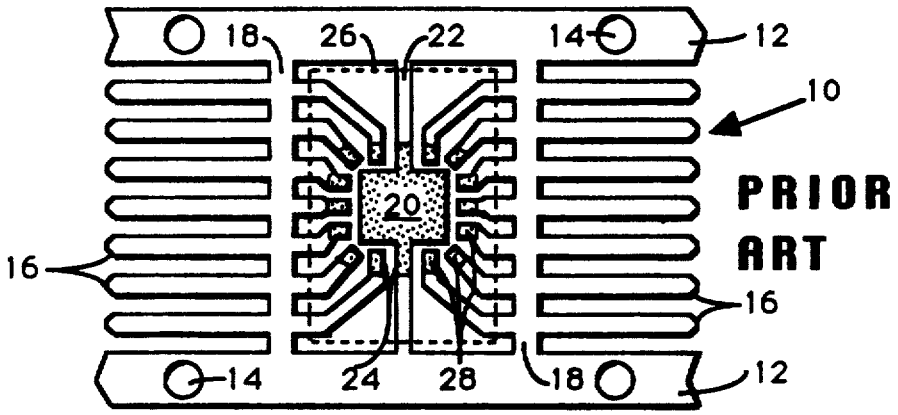
PRIOR ART FIG. 1
FIG. 1 is a simplified top view of a portion of a spot-plated leadframe according to the prior art.

FIG. 1 is a simplified top view of portion 10 of a spot-plated leadframe according to the prior art. Leadframe portion 10 comprises side-rails 12 with alignment holes 14, leads 16, dam bars 18, and die flag 20 supported by crossbar 22. Inner lead portions 24 lie adjacent to die flag 20 within the boundary of the intended plastic encapsulation indicated by dashed line 26. Die flag 20 and inner lead portions 24 are spot plated in region 28 (indicated by the light stippling in FIG. 1) to facilitate die bonding and wire bonding or equivalent.

Copper, copper alloys (e.g., beryllium copper), Alloy 42, and Kovar$^{tm}$ are examples of well known leadframe materials. Noble metals, aluminum and nickel are well known materials that are commonly plated or coated onto leadframes to facilitate bonding. The present invention is particularly well suited for use in connection with leadframes or leads that have been spot plated or coated with noble metals, but is also useful with other combinations of materials and other configurations.

As used herein, the words "plate", "plated" or "plating" are intended to refer to all methods of coating one metal on another, including but not limited to, chemical deposition, electrochemical deposition, vacuum deposition, vapor deposition, sputtering and spraying.

Figure 2:
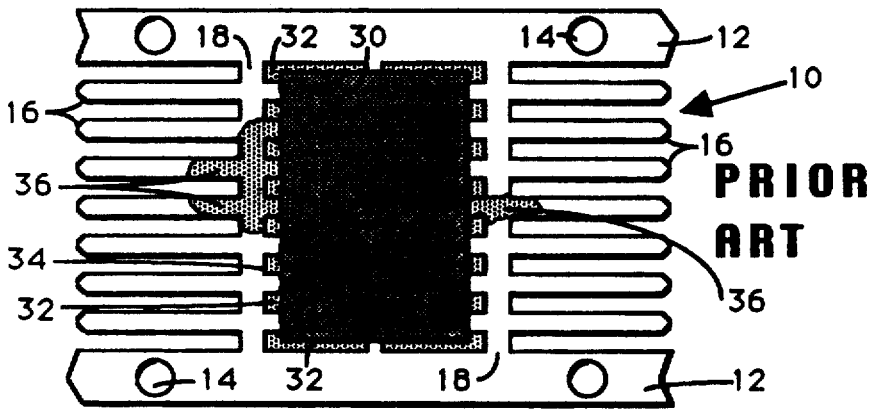
PRIOR ART FIG. 2
FIG. 2 is a top view of the leadframe portion of FIG. 1, after plastic encapsulation but before trim and plastic deflash.

FIG. 2 is a top view of leadframe portion 10 of FIG. 1, after plastic encapsulation but before lead trim and plastic deflash. Plastic encapsulation 30 has been provided at the location previously indicated by dashed line 26 in FIG. 1. Plastic encapsulation methods are well known in the art.

The encapsulation mold conventionally closes on side-rails 12 and dam bars 18, and excess plastic indicated by stippled region 32 forms in inter-lead spaces 34, creating what is referred to herein as "inter-lead plastic". In addition, when mold closure is slightly imperfect, excess plastic can also form on the upper (and lower) surfaces of leads 16 and dam bars 18 as indicated by stippled regions 36, creating what is referred to herein as "over-lead plastic" or "plastic flash".

Following encapsulation, side-rails 12 and dam bars 18 are sheared away during the "trim" operation. The trim operation conventionally removes inter-lead plastic 32, but may not remove over-lead plastic flash 36. Accordingly, it is customary in the prior art to subject the parts to a further operation, either before or after trim, to attempt to remove the over-lead plastic flash. This is typically accomplished by blasting the parts with a mild abrasive such as for example, ground apricot pits. Other mild abrasive materials may also be used. However, some plastic encapsulation resin may still remain. If it is sufficiently thin, it may be very difficult to see with the unaided eye.

Figure 3:
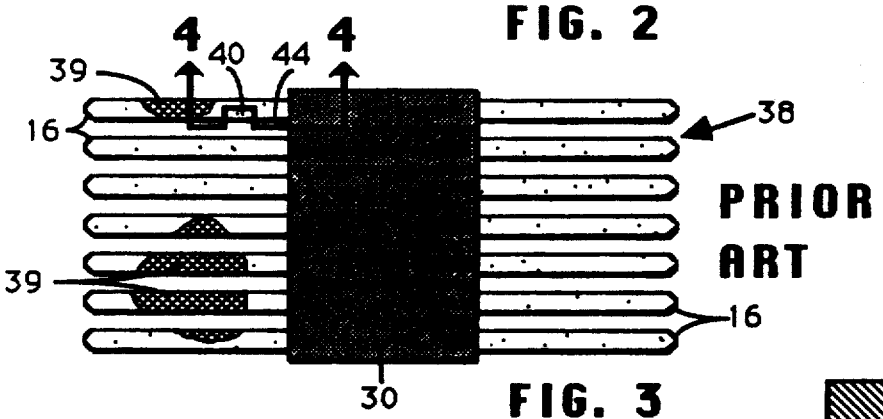
PRIOR ART FIG. 3
FIG. 3 is a top view of a device excised from the leadframe portion of FIG. 2, after lead trim and plastic deflash.

The results of the foregoing treatments are shown in FIG. 3 wherein the device has been excised from side-rails 12 and dam bars 18. Inter-lead plastic 32 and over-lead plastic flash 36 have been substantially removed. Small particles 38 of the blasting material may adhere to leads 16, as indicated by the small dots shown on leads 16 in FIG. 3 and the larger dots 38 in the magnified partial cut-away side view of a lead shown in FIG. 4. Stain regions 39 are also shown on leads 16.

Figure 4:
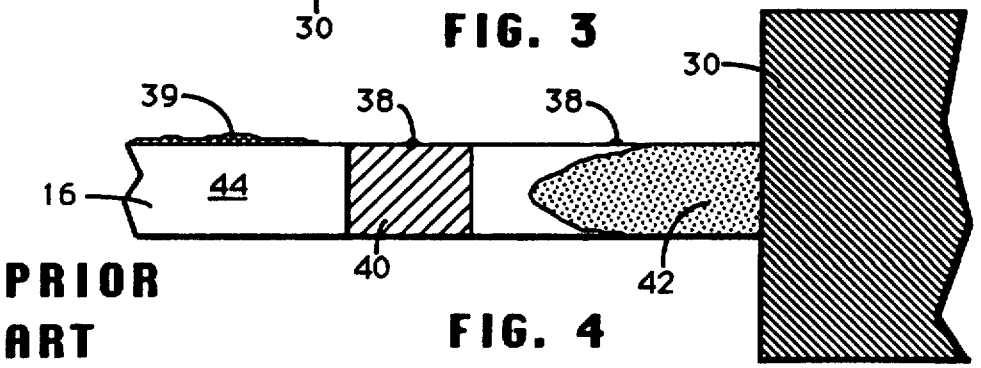
PRIOR ART FIG. 4
FIG. 4 is a much enlarged partial cut-away side view of one lead of the device of FIG. 3.

In FIG. 4, portion 40 of lead 16 is shown enlarged in cross-section and partially cut-away. Embedded blasting grain 38 and stain region 39 are visible. Residual plastic flash is not shown in FIG. 4.

Because embedded blasting particles 38, stain region 39 and any residual plastic flash can cause imperfect solder coating of leads 16 and interfere with the attachment of leads 16 to a circuit board or the like, the parts must be visually inspected. When such defects are detected the devices are rejected and must be re-worked or discarded. Inspection, rework and product discards due to such defects increase manufacturing cost.

Lightly stippled region 42 on lead 16 in FIG. 4 illustrates the presence of excess spot plating material (metal flash or bleed) on lead 16 that migrated along side 44 of lead 16 laterally outside intended spot-plated region 28 (see FIGS. 1, 3 and 4). Since plating bleed region 42 is exposed outside encapsulation 30, it can cause the growth of metal whiskers during solder coating of leads 16 or during solder re-flow or during extended high temperature operation of the finished device. Metal whisker growth is a known failure mechanism which is to be avoided. The conditions illustrated in FIG. 4 show a combination of problems encountered during manufacture of electronic devices that must be dealt with in order to obtain high quality parts that function with high reliability in their intended application.

Individual processes are known in the prior art for removing the several types of defects described above, i.e., stains, residual plastic resin (plastic flash), embedded deflash media, and spot plating bleed or flash. As noted earlier, cyanide containing materials are suitable for removing excess noble metals from many lead frame materials, but cyanide compounds present significant safety and disposal problems. Further, such cleaners, while effective for removing excess spot plate metal are not always practical for removing stains or loosening embedded blasting media. Separate cleaning steps must frequently be applied for removing these materials, frequently using highly corrosive materials such as fluoboric acid and the like, and/or the duration of the cleaning steps must be substantially extended.

Figure 5:
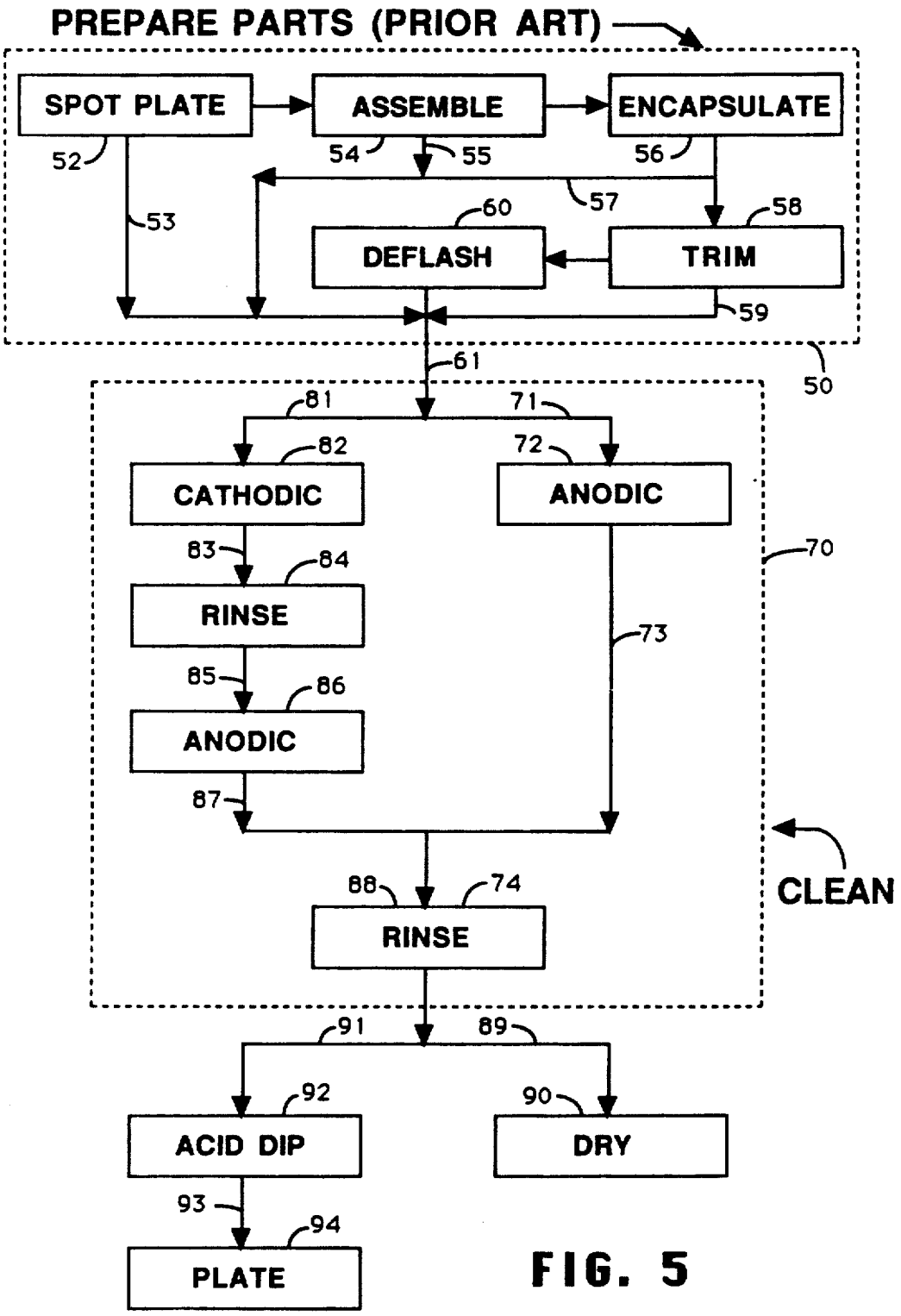
FIG. 5 is a flow chart illustrating various embodiments of the present invention.

The foregoing problems are overcome and the cleaning process much simplified and made quicker by means of the invented process which is illustrated in FIG. 5 and described in more detail below.

FIG. 5 is a flow diagram of a process suitable for cleaning metal parts according to the present invention. While the process is described as for plastic encapsulated electronic devices, those of skill in the art will appreciate that the invented process is useful for cleaning a wide variety of electronic devices and other metal parts, with or without plastic encapsulation and which may or may not have received all of the steps illustrated in "prepare parts" portion 50 of FIG. 5. Accordingly, the following description in terms of electronic devices is intended for convenience of explanation and not to be limiting.

The steps enclosed within dashed outline 50 ("prepare parts") of FIG. 5 illustrate various prior art steps 52–60 associated with electronic devices, particularly electronic devices mounted on leadframes or the like and adapted to be encapsulated in plastic, although that is not essential. Some or all of steps 50 are usually performed on electronic devices before the invented cleaning steps illustrated within dashed outline 70.

Referring now to the steps 50, in "spot plate" step 52 a leadframe is locally plated with, for example silver. It may then progress directly to cleaning steps 70 via path 53 or may advance to "assemble" step 54 wherein an electronic die is mounted on the leadframe and various wirebonds or the like attached thereto. The leadframe with the die thereon may proceed directly to cleaning steps 70 via path 55 or advance to "encapsulate" step 56 wherein a plastic or other encapsulation is provided around the die and wires. The encapsulated die and leadframe may proceed directly to steps 70 via path 57 or advance to "trim" operation 58 wherein the dam bars and side-rails, if any, are sheared away. The trimmed device and leads may then proceed directly to cleaning steps 70 via path 59 or advance to plastic "deflash" operation 60 from whence it passes to cleaning operation 70 via path 61.

Means and methods for performing all of preparatory steps 50 are well known in the art. As those of skill in the art will understand based on the description herein, preparatory steps 50 are shown merely for convenience of explanation and not intended to imply that any or all of steps 50 are necessary to the present invention, although the present invention is particularly useful in ameliorating various problems that arise as a consequence of one or more of steps 52–60.

The invented cleaning process is illustrated in several embodiments within dashed outline 70 which is intended to refer collectively to the invented electrolytic cleaning process steps. The parts incoming from steps 50 may proceed via 71 to anodic cleaning step 72 and thence via 73 to rinsing step 74. The details of the anodic cleaning step are described later. Steps 71–74 are particularly useful where the parts have substantial amounts of metal plating flash but little embedded blasting material and resin flash, and no heavy stains.

Where the parts have substantial amounts of embedded blasting material, resin flash, and/or stains as well as metal plating flash, then the cathodic-anodic cleaning process illustrated in steps 81–88 is preferred. The parts proceed via 81 to cathodic cleaning step 82, then via 83 to first rinse step 84, then via 85 to anodic cleaning step 86, and then via 87 to second rinse step 88. Cathodic step 82 is particularly effective in loosening or partially removing embedded blasting media, stains and residual plastic flash and resin bled. Anodic cleaning step 86 is particularly effective in removing metal plating flash with minimum etching of the lead metal and in completing removal of embedded blasting media, resin flash and stains loosened in the cathodic step. The combination of the steps provides very effective cleaning.

The metal parts or leads that have passed through the above-described cleaning steps have a bright shiny appearance with no evidence of embedded blasting media, residual plastic flash and resin bleed, metal plating flash, scale or stains. Any oxide present on the leads is so thin as to be substantially invisible to the unaided eye.

Where the parts are not to be plated or solder coated, they proceed via 89 to drying step 90, after which they may be stored until use. Where it is desired to plate or coat the leads with, for example solder or other protective metal, they desirably proceed via 91 to acid dip step 92 and via 93 to plating step 94. Acid dip 92 is optional but desirable and is included, for example with copper leads, to remove any thin oxide that may form during anodic cleaning step 72 or 86 or during subsequent storage. Means and methods for plating or solder coating leads or electronic devices or other parts are well known in the art.

It has been found that a solution comprising lactic acid and metal hydroxide in water is particularly effective cleaning material for removing stains, embedded blasting media, plating bleed or flash and residual plastic resin flash. Hydroxides of metals from columns 1A and 2A of the periodic table are suitable, with KOH, NaOH and mixtures thereof being particularly convenient for parts having noble metal spot plated leads. A lactic acid +KOH + water solution is preferred. The periodic table referred to is that contained in the Handbook of Chemistry and Physics, 61st edition, CRC Press, Boca Raton, Fla., inside front cover. It is desirable that the process be carried out at a slightly elevated temperature.

If the amount of embedded blasting media is small or nonexistent and there is not excessive scale or stain, anodic cleaning alone will suffice, i.e., steps 71–74. The cleaning solution for anodic step 72 conveniently comprises ingredients in proportion of about 10 to 30 liters of 88% lactic acid (e.g. food grade; specific gravity 1.2) and about 5 to 30 Kgms of KOH or NaOH or a mixture thereof (e.g. electronic grade) plus sufficient water to make about 100 liter of cleaning solution, with the proportions adjusted to give a pH in the range of about 4–7, preferably 5–6. Alternatively, a solution of 10–30% by volume of potassium (e.g., specific gravity=1.34) or sodium lactate or a mixture thereof in water may be used. This has a pH of about 5–6. While food grade and electronic grade are preferred, other grades may also be used, depending upon the sensitivity of the parts being cleaned to the impurities therein.

A typical solution useful for cleaning electronic copper leadframes comprises about 30 liters lactic acid and about 17 Kgms of KOH with sufficient water to make about 100 liters of solution or equivalent in potassium lactate in water.

The above-described anodic cleaning solution is particularly effective in removing metal plating flash without significant lead etching. For example, it removes silver flash on copper at 2–3 times the rate at which it etches the underlying copper leads. The cleaning solution is also effective for removing light stains, residual blasting media, plastic flash and resin bleed.

Where increased activity for removal of residual plastic flash or resin bleed is needed during anodic cleaning step 72, this may be accomplished by adding sufficient sulfuric acid to give a pH of 1.4–2, preferably 1.4–1.5, but this is not essential. Reagent grade and 98% sulfuric acid is preferred, but other grades and concentrations may be used provided that the impurities therein do not adversely affect the parts being cleaned and the amount added is adjusted for the initial acid concentration.

Useful anodic cleaning times with the lactic acid+-KOH sulfuric acid+water cleaning solution are about 10 to 100 seconds with 20 to 30 seconds being convenient and about 22 seconds being typical. Copper leadframes treated in this manner are clean, bright and shiny with no evidence of stain, residual plastic flash or resin bleed, blasting media or metal flash. Any surface oxide remaining or formed thereon is substantially invisible to the unaided eye.

Where large amounts of embedded blasting media and/or heavy staining or scale are encountered, cathodic-anodic cleaning is desirable, i.e., steps 81–88. The anodic cleaning solution described above for anodic cleaning step 72 is useful for anodic cleaning step 86 and may also be used for cathodic cleaning step 82. However, less expensive solutions are useful for cathodic step 82 and are preferred. For example, a preferred cathodic cleaning solution for step 82 comprises about 3 to 6 Kgms of KOH or NaOH or a mixture thereof (e.g., electronic grade) into water per 100 liters of cathodic solution, with about 4.5 Kgms per 100 liters of solution being typical. Less expensive grades may be used Provided that the impurities therein do not adversely affect the parts being cleaned.

The anodic and cathodic cleaning solutions are placed in conventional electrolytic cleaning tanks of several hundred liters capacity and held at 60°–80° C. with about 70° C. being preferred for the cathodic (hydroxide-water) tank and about 40°–60° C. being useful and about 50° C. being preferred for the anodic (lactate-water) tank. Plastic (e.g., polypropylene) tanks are preferred and larger or smaller capacities may be used depending on the size and shape of the parts being cleaned and the desired throughput. The lower the temperature the lower the reaction rate, and the higher the temperature the greater the solution decomposition rate. Thus, excessively high or low temperatures are not as effective. It is desirable to circulate the solution in the tanks although this is not essential because of the relatively short immersion times typically used.

The parts to be cleaned according to steps 70 are conveniently clamped on a stainless steel rack or placed on a stainless steel belt, tray or barrel and then immersed in the anodic cleaning solution according to steps 71–74, or the cathodic and anodic cleaning solutions according to steps 81–88. Electrical contact to the parts is through this metal rack, belt, tray or barrel. Counter electrodes of stainless steel (anodic and cathodic bath) or copper (anodic bath) are provided in the solution, with stainless steel being preferred. The parts holder and counter electrodes are connected to one or more power supplies capable of providing at least about 75 amps at about 2–15 volts, typically 5–50 amps at 9–10 volts. The racks, power supplies and counter electrodes are conventional Typical cleaning times for electronic ladder leadframes for discrete semiconductor devices and/or for integrated circuits are described below. Those of skill in the art will understand that the times required for optimum results will vary with the shape and size of the parts being cleaned, the concentrations being used, the bath temperatures and the voltages and current densities applied. However, based on the teachings herein, those of skill in the art will be able to adjust these parameters to suit their particular needs without undue experimentation.

Anodic treatment times for step 72 are conveniently in the range of 2–200 seconds with 5–100 being convenient and 20–25 seconds being typical.

Cathodic treatment times for step 82 are conveniently in the range of 1–100 seconds with 2–50 second being convenient and 10–15 seconds being typical.

Anodic treatment times for step 86 are conveniently in the range of 2–200 seconds with 5–100 being convenient and 20–25 seconds being typical. The relative cathodic and anodic treatment times are desirably in the ratio of about 1:1 to 1:2 (cathodic time:anodic time).

The less the plating or dirt or material being removed the shorter the treatment time needed for effective removal and vice-versa. However, excessively long treatment time merely results in unnecessary etching and/or oxidation of the leads and, for electronic devices, a degradation of encapsulation integrity.

While the cathodic-anodic treatment may be carried out in a single bath, as for example when the same cleaning solution is being used for both cathodic and anodic cleaning cycles, it is more desirable to use separate tanks with a rinse in between. In this way the conditions in each cleaning tank may be optimized for that portion of the cleaning cycle.

It is desirable to provide rinse step 74, 88 after anodic cleaning steps 72, 86, respectively. It is desirable but not essential to provide rinse step 84 between cathodic cleaning step 82 and anodic cleaning step 86 so as to avoid cross-contamination of the plating solutions in steps 82 and 86. A water rinse sufficient to substantially remove residual cleaning solution is sufficient in both cases.

Also, where highly soluble metals such as for example copper and silver are present on the leadframes, it is desirable to provide a removable porous bag or the like around the counter electrode in the anodic cleaning tank to pick up metals falling from the cathode for easy clean-up Acid dip step 92 is intended to remove any residual oxide formed during anodic step 72, 86 or otherwise. With copper containing leads, a solution of 10–40% methylsulfonic acid in water is useful with 20–30% being preferred. Acid dip bath temperature is usefully about 35°–70° C. with about 45°–60° C. being conveniently and about 50°–55° C. being preferred. Immersion times of about 2–30 seconds are useful with about 5–10 seconds being convenient and about 7 seconds being preferred. Other acid dips well known in the art can also be used provided they do not adversely affect the parts being treated.

Plating step 94 is conventional and typically comprises solder plating or solder coating using means well known in the art.

The following are examples of the practice of the method of the invention under different conditions.

EXAMPLE A

Standard plastic encapsulated SOT-23 ladder leadframes composed of an Alloy 42 (42% Ni, balance Fe) base completely covered with about 4.4 micrometers of OFHC copper plate, and with silver spot plating and substantial silver flash and bleed, scale, blasting media, plastic flash and resin bleed were clamped on a stainless steel belt and first immersed in a first cleaning solution comprising about 4.5 Kgms of KOH per 100 liters of DI water, in a plastic tank at about 70° C. and subjected to a cathodic cleaning cycle at 9 volts and 50–60 amperes for about 10 seconds. The parts were withdrawn from the first cleaning solution, rinsed and then placed in a second cleaning solution comprising about 30% by volume potassium lactate and 5% by volume lactic acid and the balance DI water, and having a pH of 4–5, and subjected to anodic cleaning at 9 volts and 30–70 amperes for about 12 seconds. The parts were then withdrawn from the second cleaning solution and rinsed. Each rinse step was performed under a DI water spray for about 5 seconds to remove substantially all of the preceding solution.

The leads were inspected and found to be clean, bright, shiny and free from any scale, plastic flash, resin bleed, blasting compound and residual metal flash or bleed.

EXAMPLE B

Standard plastic encapsulated 14/16 lead IC ladder leadframes of Olin 194 copper with silver spot plating and substantial silver plating bleed and some scale, plastic flash and resin bleed were clamped to a stainless steel belt and immersed in a cleaning solution comprising 10% potassium lactate, about 2% sulfuric acid (98%) and the balance DI water at about 52°±2° C. and under anodic potential for about 22 seconds. The pH of the solution was about 1.48–1.50. The parts were then removed, rinsed as described above and inspected. The leads were found to be clean, bright, shiny and without evidence of any plating bleed, scale, plastic flash or resin bleed.

EXAMPLE C

As a further test the parts cleaned as described in Examples A and B above were acid dipped in a methylsulfonic acid solution (20–30% by volume of 70% acid in water) at 54°±3° C. for about 7 seconds, then rinsed (as above) and the leads solder plated with about 13±1.3 micrometers of Sn:Pb (80:20) solder using standard techniques. The finished solder plated parts were aged in air at 175°±5° C. for five hours and in steam (95° C.) for 32 hours and then tested for solderability and inspected for de-wetting, non-wetting, pin holes and bridging using standard techniques. All parts passed indicating substantially complete removal of all solder inhibiting surface layers and removal of plating flash (and bleed) that otherwise cause solder coverage and/or shorts rejects.

Having thus described the invention, those of skill in the art will understand that the invented method provides a particularly effective way of cleaning leads or electrodes on electronic devices, particularly semiconductor devices, in that a unified cleaning treatment removes stains, removes embedded blasting media used for plastic deflash, and removes excess plating metal, removes residual plastic flash and resin bleed. The cleaning treatment provides finished leads that are clean, brightly polished and free from surface defects, visible oxides, or contaminants that otherwise adversely affect manufacturing yield, cost, device performance and reliability. Further, removal of all these different types of undesirable contaminates is accomplished using raw materials (e.g., lactic acid and/or KOH or NaOH, and water, or sodium or potassium lactate and water) that are particularly inexpensive compared to prior art cleaning materials used for similar tasks. Further, the health and safety hazards associated with some prior art cleaning materials are greatly reduced.

A particular feature and advantage of the invented method is that, not only does it clean scale, plastic and blasting residue from electronic device leads, but it selectively etches excess noble metal plating faster than the underlying leads. This is particularly important where the leads are not solid but consist of a base metal (e.g., Alloy 42) covered with a comparatively thin surface layer of another metal (e.g., copper) which has been spot plated with a still further metal (e.g., silver). For example, it is essential that the copper surface layer not be stripped during the lead cleaning process used to remove the excess silver and the residual plastic, resin and blasting media. The above-described invention accomplishes this combination of effects.

While the invented process has been particularly described for removing, among other things, silver from copper containing or copper plated leads, those of skill in the art will appreciate based on the description herein that the invented process may be used with other combinations of materials of interest in the electronics art and elsewhere, as for example but not limited to, removing other noble metals and alloys thereof from leads composed of a wide variety of metals and metal alloys well known in the art, including but not limited to those leadframe materials listed earlier in this description. Further, while the process has been illustrated in terms of particular solution concentrations, volumes and temperatures, agitation, polarities, electrodes and other circumstances, those of skill in the art will understand based on the description herein how to utilize without undue experimentation other combinations of these conditions to achieve their particular ends.

For example, while the cathodic-anodic cleaning steps are described in terms of a single cathodic clean followed by a single anodic clean, the similar effects may be obtained by using multiple cathodic-anodic cycles. Multiple polarity reversal of a DC potential or by using an AC cathodic-anodic cycles may be provided by sequential potential. It is desirable that the multiple cycles finish with an anodic cycle.

While multiple or combined (single-bath) cathodic-anodic cycles may be used, it is preferable to perform the cathodic and anodic cycles in separate tanks, or at least with separate solutions, so that each may be separately optimized and undesirable plating of dissolved metals or contaminants onto the leads minimized. Under these circumstances, a single cathodic and single anodic cycle is less complicated.

Further, while the cleaning solution is described in terms of being made from lactic acid and KOH or NaOH, those of skill in the art will understand that potassium of sodium lactate (or other column 1A or 2A lactates) may also be used, so long as the solution has the equivalent amount of lactate and hydroxide and inorganic acid is adjusted to have the desired pH, e.g., 1.4–7, and that other carboxylic acids or compounds may be used instead of lactic acid or lactates, although the latter are preferred and are believed to offer better performance for the particular combination of problems encountered with spot plated electronic leadframes. Examples of suitable alternative carboxylic acids to be mixed with metal hydroxides are acetic, tartaric or citric acids or salts such as potassium or sodium acetate, tartrate or citrate.

Additionally, while water has been used as the diluent for the lactates and hydroxides, other polar solvents which permit dissociation of the active ingredients in solution may also be used alone or in combination with water. Alcohols or water-glycol mixtures are examples of suitable alternative solvents. Those of skill in the art will understand that other materials may be added to the described solutions without departing from the scope of the present invention.

Further, while the process has been described in terms of cleaning leads of electronic devices, those of skill in the art will understand based on the descriptions herein that the present invention is useful for cleaning a wide variety of metal parts besides leads of electronic devices.

Accordingly, it is intended to include these and other variations as will occur to those of skill in the art based on the teachings herein in the claims that follow.

We claim:

1. A method for cleaning leads of electronic devices comprising:

providing leads of a first metal having thereon a plated region of a second metal, wherein the first metal comprises copper and the second metal comprises silver or other noble metal; and immersing the leads in a solution comprising lactic acid and a metal hydroxide and applying an electrical potential between the leads and a reference electrode contacting the solution to remove silver or other noble metal at a rate faster than the removal rate of copper.

2. The method of claim 1 wherein the immersing step comprises immersing in a solution comprising lactic acid and a hydroxide of a metal from columns 1A or 2A of the periodic table.

3. The method of claim 2 wherein the immersing step comprises immersing in a solution comprising lactic acid and potassium or sodium hydroxide or a combination thereof.

4. The method of claim 1 wherein the applying step comprises making the leads anodic with respect to the reference electrode for a predetermined first time.

5. The method of claim 1 wherein the immersing step comprises immersing in a solution having proportions comprising about 10–30% by volume of about 60% concentration potassium or sodium lactate or a combination thereof in water.

6. The method of claim 1 wherein the immersing step comprises immersing in a solution having proportions comprising about 10 to 30 liters of lactic acid and about 5 to 30 Kgms of KOH or NaOH or a combination thereof in water per 100 liters of solution.

7. The method of claim 1 wherein the immersing step comprises immersing in a solution having proportions comprising about 10 to 30 liters of lactic acid and about 5 to 30 Kgms of KOH, NaOH or a mixture thereof in water, or an equivalent solution of potassium or sodium lactate in water, together with sufficient other inorganic acid to give a pH in the range of 1.4–2, per 100 liters of solution.

8. The method of claim 1 wherein the immersing step comprises immersing in the solution for a cleaning time in the range of about 2–200 seconds.

9. The method of claim 8 wherein the immersing step comprises immersing in the solution for a cleaning time in the range of about 10–40 seconds.

10. The method of claim 1 wherein the immersing step comprises immersing in a solution having a pH in the range of 1.4–7.

11. A method for cleaning leads of electronic devices comprising, providing leads of a first metal having *thereon* a plated region of a second metal, immersing the leads in a solution comprising lactic acid and a metal hydroxide, and applying an electrical potential between the leads and a reference electrode contacting the solution, wherein the applying step comprises first making the leads cathodic with respect to the reference electrode for a predetermined first time and then making the leads anodic with respect to the reference electrode for a predetermined second time.

12. A method for cleaning leads of electronic devices comprising, providing leads of a first metal having thereon a plated region of a second metal, immersing the leads in a solution comprising lactic acid and a metal hydroxide, and applying an electrical potential between the leads and a reference electrode contacting the solution, wherein the immersing step comprises first immersing in a first solution having proportions comprising about 3–6 Kgms KOH, NaOH or mixture thereof in water per 100 liters of the first solution and applying cathodic potential to the leads, and then immersing the leads in a second solution having proportions comprising about 10 to 30 liters of lactic acid and about 5 to 30 Kgms of KOH or NaOH or a combination thereof in water per 100 liters of the second solution or an equivalent solution of potassium or sodium lactate in water and applying anodic potential to the leads.

13. A method for cleaning leads of electronic devices comprising, providing leads of a first metal having thereon a plated region of a second metal, immersing the leads in a solution comprising lactic acid and a metal hydroxide, and applying an electrical potential between the leads and a reference electrode contacting the solution, wherein the applying step comprises applying a cathodic and anodic voltage to the leads wherein the relative cathodic and anodic time durations are in proportion of about 1:1 to 1:2, respectively.

14. A method for treating parts of a first metal having thereon an exposed region of a second metal to remove the exposed second metal, comprising, immersing the metal parts in a solution comprising lactic acid and a metal hydroxide and a polar solvent, and applying an electrical potential between the metal parts and a reference electrode contacting the solution, wherein the first metal comprises copper and the second metal comprises silver [of] *or* another noble metal.

15. The method of claim 14 wherein the applying step comprises applying anodic potential to the metal parts.

16. A method for treating metal parts of a first metal having thereon an exposed region of a second metal, to remove at least part of the exposed second metal, comprising, immersing the metal [pear] *parts* in a solution comprising lactic acid and a metal hydroxide and a polar solvent, and applying an electrical potential between the metal parts and a reference electrode contacting the solution, wherein the first metal comprises copper and the second metal comprises a noble metal, and wherein the applying step comprises first applying cathodic potential *and then applying anodic potential* to the metal parts.

17. A method for treating metal parts of a first metal having thereon an exposed region of a second metal, to remove at least part of the exposed second metal, comprising, immersing the metal parts in a solution comprising lactic acid and a metal hydroxide and a polar solvent, and applying an electrical potential between the metal parts and a reference electrode contacting the solution, wherein the first metal comprises copper and the second metal comprises a noble metal, and further, prior to the immersing and applying steps, placing the parts in another solution comprising a metal hydroxide and a polar solvent wherein the parts are subjected to a cathodic potential, and then performing the immersing and applying steps wherein anodic potential is applied to the parts.

18. A method for cleaning copper leads that have exposed silver thereon comprising:

immersing the leads in a cleaning solution comprising a polar solvent in which has been dissolved lactic acid and a metal hydroxide, or a metal lactate; and applying an anodic potential to the leads [to] to remove silver more rapidly than copper.

19. A method for cleaning copper leads that have exposed silver thereon comprising, immersing the leads in a [clean] *cleaning* solution comprising a polar solvent in which has been dissolved lactic acid and a metal hydroxide, or a metal lactate, and applying an anodic potential to the leads, and further comprising prior to the immersing and applying steps, placing the leads in another solution comprising a metal hydroxide [a] *and* a polar solvent wherein the leads are subjected to a cathodic potential.

*20. A method of removing non-metal material from metal surfaces comprising the steps of:*

*providing a metal surface having thereon non-metal material to be removed; and*

*immersing said metal surface in a solution comprising lactic acid and a metal hydroxide and applying an electrical potential between said metal surface and a reference electrode contacting said solution to remove said non-metal material at a rate faster than the removal rate of the metal.*

*21. The method of claim 20 wherein the immersing step comprises immersing in a solution comprising lactic acid and a hydroxide of a metal from column 1A or 2A of the periodic table.*

*22. The method of claim 21 wherein the immersing step comprises immersing in a solution of lactic acid and potassium or sodium hydroxide or a combination thereof.*

*23. The method of claim 20 wherein the metal surface is made anodic with respect to the reference electrode for a predetermined first time.*

*24. The method of claim 20 wherein the immersing step comprises immersing in a solution having proportions comprising about 10 to 30% by volume of about 60% concentration potassium or sodium lactate or a combination thereof in water.*

*25. The method of claim 20 wherein the immersing step comprises immersing in a solution having proportions comprising about 10 to 30 liters of lactic acid and about 5 to 30 Kgms of KOH, NaOH or a combination thereof in water per 100 liters of solution.*

*26. The method of claim 20 wherein the immersing step comprises immersing in a solution having proportions comprising about 10 to 30 liters of lactic acid and about 5 to 30 Kgms of KOH, NaOH or a combination thereof in water, or an equivalent solution of potassium or sodium lactate in water, together with sufficient other inorganic acid to give a pH in the range 1.4 to 2, per 100 liters of solution.*

*27. The method of claim 20 wherein the immersing step comprises immersing in the solution for a time in the range of about 2 to 200 seconds.*

*28. The method of claim 27 wherein the immersing step comprises immersing in the solution for a time in the range of about 10 to 40 seconds.*

*29. The method of claim 20 wherein the immersing step comprises immersing in a solution having a pH in the range of 1.4 to 7.*

*30. The method of claim 20 wherein the providing step comprises providing a copper surface having one or more of oxide, plastic, resin or deflashing media to be removed.*

*31. The method of claim 30 wherein the providing step comprises providing copper leads of electronic devices.*

*32. A method for removing non-metal materials from copper comprising:*

*immersing copper having non-metal material thereon in a solution comprising a polar solvent in which has been dissolved lactic acid and a metal hydroxide or a metal lactate; and*

*applying an anodic potential to said copper to remove said non-metal material more rapidly than said copper.*

*33. The method of claim 32 wherein the applying step includes removing one or more of oxide, plastic, resin and deflashing media.*

*34. A method for cleaning copper having non-metal material thereon comprising immersing said copper in a solution comprising a polar solvent in which has been dissolved lactic acid and a metal hydroxide or a metal lactate, and applying an anodic potential to said copper and further comprising prior to the immersing and applying steps, placing said copper in another solution comprising a metal hydroxide and polar solvent wherein said copper is subjected to a cathodic potential.*

*35. The method of claim 34 wherein the non-metal material includes one or more of oxide, plastic, resin or deflashing media.*

*36. A method for cleaning leads of electronic devices comprising providing metal leads having non-metal material thereon, immersing said leads in a solution comprising lactic acid and a metal hydroxide and applying an electrical potential between said leads and a reference electrode contacting said solution, wherein the immersing step comprises first immersing in a first solution having proportions comprising about 3 to 6 Kgms KOH, NaOH, or a mixture thereof in water per 100 liters of said first solution and applying cathodic potential to said leads, and then immersing said leads in a second solution having proportions comprising about 10 to 30 liters of lactic acid and about 5 to 30 Kgms of KOH, NaOH or a combination thereof in water per 100 liters of said second solution or an equivalent solution of potassium or sodium lactate in water and applying an anodic potential to said leads.*

*37. A method for removing non-metal material from metal surfaces comprising providing a metal surface having thereon non-metal material to be removed, immersing said metal surface in a solution comprising lactic acid and a metal hydroxide and applying an electrical potential between said metal surface and a reference electrode contacting said solution wherein the applying step comprises a applying cathodic and anodic voltage to said metal surface wherein the relative cathodic and anodic time durations are in proportion of about 1:1 to 1:2 respectively.*

*38. The method of claim 37 wherein the metal comprises copper and the non-metal material is one or more of oxide, plastic, resin and deflashing media.*

*39. The method of claim 38 wherein the metal comprises leads of electronic devices.*

*40. An electrolytic bath for differentially removing noble metals and non-metal material from copper consisting essentially of lactic acid and a metal hydroxide in aqueous solution.*

*41. The bath of claim 40 wherein the metal hydroxide is a hydroxide of a metal from columns 1A or 2A of the periodic table.*

*42. The bath of claim 41 wherein the metal hydroxide comprises potassium or sodium hydroxide or a combination thereof.*

*43. The bath of claim 40 wherein the solution has proportions comprising about 10 to 30% by volume of about 60% concentration potassium or sodium lactate or a combination thereof in water.*

*44. The bath of claim 40 wherein the solution has proportions comprising about 10 to 30 liters of lactic acid and about 5 to 30 Kgms of KOH or NaOH or a combination thereof in water per 100 liters of solution.*

*45. The bath of claim 40 having a pH of 1.4 to 7.*

*46. The bath of claim 40 wherein said bath differentially removes one or more of silver, oxide, plastic, resin or deflashing media from copper.*

*47. An electrolytic bath for differentially removing noble metals and non-metal materials from copper wherein the solution has proportions comprising about 10 to 30 liters of lactic acid and about 5 to 30 Kgms of KOH, NaOH or a combination thereof in water or an equivalent solution of potassium or sodium lactate in water, together with sufficient other inorganic acid to give a pH in the range of 1.4 to 2, per 100 liters of solution.*

* * * * *